United States Patent
Peng et al.

(10) Patent No.: US 10,334,693 B2
(45) Date of Patent: Jun. 25, 2019

(54) LIGHT SOURCE MODULE

(71) Applicant: Lite-On Technology Corporation, Taipei (TW)

(72) Inventors: Yao-Chi Peng, Taipei (TW); Po-Chang Li, Taipei (TW); Ming-Hung Chien, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 15/978,209

(22) Filed: May 14, 2018

(65) Prior Publication Data

US 2018/0376562 A1  Dec. 27, 2018

Related U.S. Application Data

(60) Provisional application No. 62/525,157, filed on Jun. 26, 2017.

(30) Foreign Application Priority Data

Mar. 7, 2018  (CN) .......................... 2018 1 0185199

(51) Int. Cl.
*H05B 37/02* (2006.01)
*G02B 27/09* (2006.01)
*G02B 7/04* (2006.01)
*G02F 1/1335* (2006.01)

(52) U.S. Cl.
CPC ............... *H05B 37/02* (2013.01); *G02B 7/04* (2013.01); *G02B 27/0955* (2013.01); *G02F 1/133504* (2013.01); *G02F 1/133526* (2013.01)

(58) Field of Classification Search
CPC ............... H05B 37/02; G02F 1/133526; G02F 1/133504; G02B 27/0955; G02B 7/04
See application file for complete search history.

(56) References Cited

U.S. PATENT DOCUMENTS

| | | | |
|---|---|---|---|
| 8,027,095 B2 * | 9/2011 | Havens | G06K 7/10702 359/665 |
| 2005/0036195 A1 * | 2/2005 | Nishioka | G02B 3/14 359/291 |
| 2009/0231677 A1 * | 9/2009 | Park | G02B 3/14 359/319 |
| 2014/0049945 A1 * | 2/2014 | Yeh | F21V 5/048 362/101 |
| 2018/0042076 A1 * | 2/2018 | Nolan | H01L 25/0753 |

* cited by examiner

*Primary Examiner* — Anh T Mai
*Assistant Examiner* — Glenn D Zimmerman
(74) *Attorney, Agent, or Firm* — JCIPRNET

(57) ABSTRACT

A light source module including a light emitting element, a tunable-focal length lens and a controller is provided. The light emitting element is configured to emit a light beam. The tunable-focal length lens is disposed on a transmission path of the light beam. The controller is coupled to the tunable-focal length lens, and adjusts a characteristic of the tunable-focal length lens in a first status and a second status.

9 Claims, 6 Drawing Sheets

LIGHT SOURCE MODULE

CROSS-REFERENCE TO RELATED APPLICATION

This application claims the priority benefit of U.S. provisional application Ser. No. 62/525,157, filed on Jun. 26, 2017 and China application serial no. 201810185199.8, filed on Mar. 7, 2018. The entirety of each of the above-mentioned patent applications is hereby incorporated by reference herein and made a part of specification.

BACKGROUND OF THE INVENTION

Field of the Invention

The invention relates to a light source module, and particularly relates to a light source module having a tunable-focal length lens.

Description of Related Art

Most of lighting fixtures have their luminescent characteristics fixed before being delivered from manufacturers. However, under different climate conditions, optical behaviours of light beams are also different. Since climate conditions of different nations are different, various nations all have their own regulations to regulate the lighting fixtures.

For example, in a sunny day or in a low mist environment, concentration of moisture in the environment is relatively low, and light beam is easier to be propagated in an environmental medium in a straight-forward manner. In this case, the light beam with a higher color temperature is more suitable. On the other hand, in a rainy day or a misty environment, concentration of moisture in the environment is relatively high, and light beam is easier to be propagated in a scattering manner in such environment, so that propagation capability of beam energy is relatively poor, and in this case, the light beam with a lower color temperature is more suitable. However, the existing lighting fixtures have their luminescent characteristics fixed before being delivered from manufacturers, and the lighting fixtures are only adapted to a single environment, and have poor environmental adaptability. If the existing lighting fixtures are to be applied in different areas, lighting fixtures having different luminescent characteristics have to be correspondingly designed, which may greatly increase manufacturing cost. Moreover, even if the lighting fixtures with specific optical parameters are designed for a specific area, due to the changing climate, the lighting fixtures are not adapted to different environments. Therefore, to resolve the above problem has always been a target for related technicians of the field.

SUMMARY OF THE INVENTION

The invention is directed to a light source module, which is adapted to adjust an optical characteristic of a light beam emitted by the light source module.

An embodiment of the invention provides a light source module including a light emitting element, a tunable-focal length lens and a controller. The light emitting element is configured to emit a light beam. The tunable-focal length lens is disposed on a transmission path of the light beam. The controller is coupled to the tunable-focal length lens, and adjusts a characteristic of the tunable-focal length lens in a first status and a second status.

In an embodiment of the invention, in the first status, the controller provides a first voltage to the tunable-focal length lens, and the light beam penetrating through the tunable-focal length lens has a first light shape. In the second status, the controller provides a second voltage to the tunable-focal length lens, and the light beam penetrating through the tunable-focal length lens has a second light shape. The first voltage is different to the second voltage.

In an embodiment of the invention, the tunable-focal length lens is a liquid state lens or a liquid crystal tunable-focal length lens.

In an embodiment of the invention, the tunable-focal length lens has a light output surface. The characteristic is a shape of the light output surface. In the first status, the light output surface of the tunable-focal length lens has a first shape. In the second status, the light output surface of the tunable-focal length lens has a second shape. The first shape is different to the second shape.

In an embodiment of the invention, the tunable-focal length lens has a light output surface. The characteristic is a shape of the light output surface. In the first status, a path of the light beam transmitted from the light emitting element to the light output surface is a first optical path. In the second status, a path of the light beam transmitted from the light emitting element to the light output surface is a second optical path. A length of the first optical path is different to a length of the second optical path.

In an embodiment of the invention, the light source module includes a plurality of light diffusion structures. The light diffusion structures are disposed in the tunable-focal length lens.

In an embodiment of the invention, in the first status, the light beam penetrating through the tunable-focal length lens has a first color temperature. In the second status, the light beam penetrating through the tunable-focal length lens has a second color temperature. The first color temperature is different to the second color temperature.

In an embodiment of the invention, the tunable-focal length lens is the liquid crystal tunable-focal length lens. The characteristic is an arrangement state of the liquid crystal tunable-focal length lens. In the first status, the arrangement state of liquid crystal molecules of the liquid crystal tunable-focal length lens is a first arrangement state. In the second status, the arrangement state of the liquid crystal molecules of the liquid crystal tunable-focal length lens is a second arrangement state. The first arrangement state is different to the second arrangement state.

In an embodiment of the invention, the light source module further includes an environmental parameter sensor. The environmental parameter sensor is used for sensing an environmental parameter of an environment where the light source module is located. The controller provides a voltage to the tunable-focal length lens according to the environment parameter.

In an embodiment of the invention, the light source module further includes a secondary lens. The secondary lens is disposed at a light path downstream of the tunable-focal length lens.

According to the above description, in the light source module of the invention, the controller adjusts the characteristic of the tunable-focal length lens in different statuses, such that when the light beam penetrates through the tunable-focal length lens in different statuses, the corresponding optical characteristic thereof is changed, so as to be adapted to different environments.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
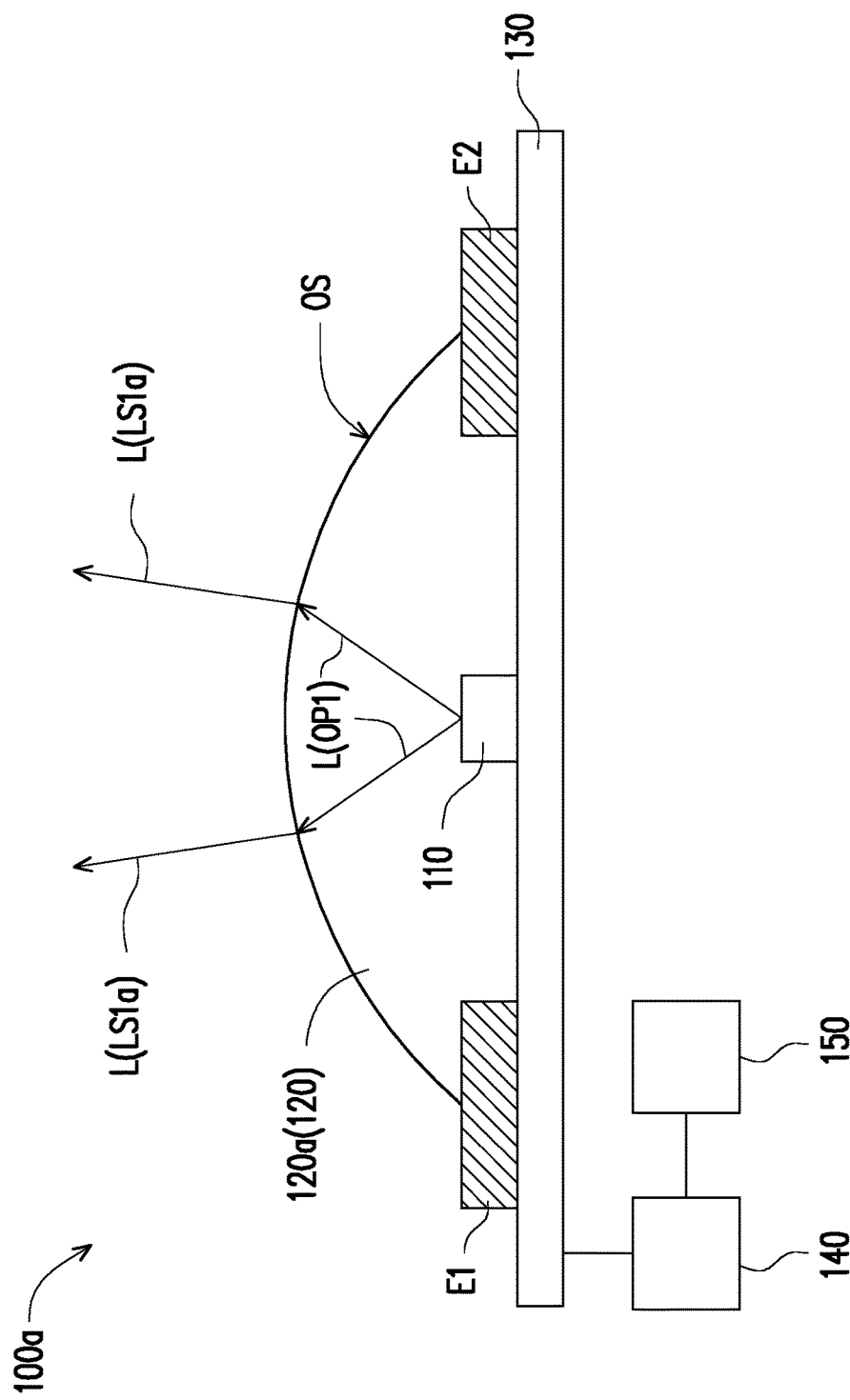
FIG. 1A is a schematic diagram of a light source module in a first status according to an embodiment of the invention.
Figure 1B:
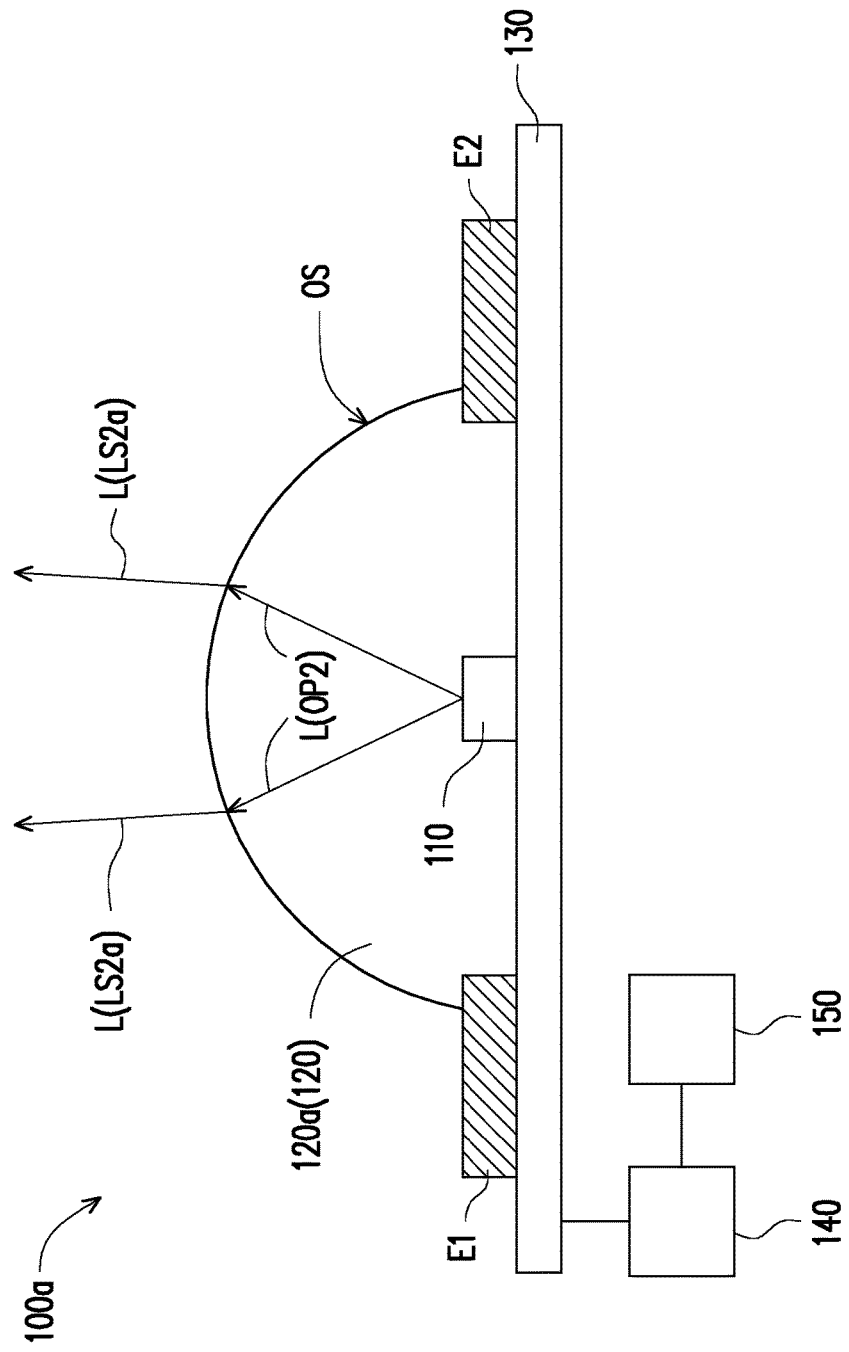
FIG. 1B is a schematic diagram of the light source module of FIG. 1A in a second status.

FIG. 1A is a schematic diagram of a light source module in a first status according to an embodiment of the invention. FIG. 1B is a schematic diagram of the light source module of FIG. 1A in a second status. Referring to FIGS. 1A and 1B, in the present embodiment, the light source module 100a includes a light emitting element 110, a tunable-focal length lens 120, a circuit carrier 130, a controller 140 and an environmental parameter sensor 150. The above components and configuration relationships of these components are described in detail below.

The light emitting element 110 generally refers to an optical element having a light emitting function. The light emitting element 110 is adapted to emit a light beam L. For example, the light emitting element 110 may be a semiconductor light emitting element, which is, for example, a Light Emitting Diode (LED), an Organic Light Emitting Diode (OLED), a Laser Diode (LD), etc., which has the light emitting function, though the invention is not limited thereto. A wavelength range of the light beam L may be from 300 nm to 1000 nm, i.e. the range covers the wavelength range from ultraviolet to infrared, though the invention is not limited thereto.

The tunable-focal length lens 120 generally refers to an optical element where a focal length thereof may be adjusted through voltages, and the tunable-focal length lens 120 is disposed on a transmission path of the light beam L. In the present embodiment, the tunable-focal length lens 120 may be implemented by a liquid state lens 120a, though implementation of the tunable-focal length lens 120 is not limited thereto. In the following descriptions, the tunable-focal length lens 120 implemented by the liquid state lens 120a is taken as an example for description. In the present embodiment, the light emitting element 110 is disposed in the liquid state lens 120a.

The circuit carrier 130 is, for example, a rigid circuit board, a flexible circuit board or a circuit carrier formed by disposing a flexible circuit thin-film on a rigid board, which is not limited by the invention. Two electrodes E1 and E2 are disposed on the circuit carrier 130. The liquid state lens 120a is coupled to the two electrodes E1, E2.

The controller 140 is, for example, a Central Processing Unit (CPU), a microprocessor, a Digital Signal Processor (DSP), a programmable controller, a Programmable Logic Device (PLD) or other similar devices, or a combination of the above devices, which is not limited by the invention. The controller 140 is coupled to the circuit carrier 130 and the two electrodes E1, E2, and is coupled to the liquid state lens 120a through the two electrodes E1, E2.

The controller 140 provides a voltage to the liquid state lens 120a through the two electrodes E1, E2 to adjust a characteristic of the liquid state lens 120a in a first status and a second status. Optical behaviours of the light source module 100 of the present embodiment in different statuses are described in detail below.

Referring to FIG. 1A, in a first status, the controller 140 provides a first voltage to the liquid state lens 120a. The first voltage is, for example, zero volt or non-zero volt, which is not limited by the invention. The characteristic of the liquid state lens 120a is a shape of a light output surface OS of the liquid state lens 120a. The shape of the light output surface OS of the liquid state lens 120a is a first shape. The light beam L penetrating through the liquid state lens 120a having the light output surface OS of the first shape has a first light shape LS1a. A path of the light beam L transmitted from the light emitting element 110 to the light output surface OS with the first shape is a first optical path OP1.

Referring to FIG. 1B, in the second status, the controller 140 provides a second voltage to the liquid state lens 120a. The second voltage is different to the first voltage. The shape of the light output surface OS of the liquid state lens 120a is a second shape. The light beam L penetrating through the liquid state lens 120a having the light output surface OS of the second shape has a second light shape LS1a. A path of the light beam L transmitted from the light emitting element 110 to the light output surface OS with the second shape is a second optical path OP2.

Referring to FIG. 1A and FIG. 1B, since the first voltage and the second voltage provided to the liquid state lens 120a by the controller 140 are different, the first shape and the second shape are also different, and curvatures of the corresponding surface shapes are also different, so that the first light shape LS1a is different to the second light shape LS2a. A length of the first optical path OP1 is different to a length of the second optical path OP2. For example, in the present embodiment, the length of the first optical path OP1 is, for example, smaller than the length of the second optical path OP2. In other embodiments, the length of the first optical path OP1 may also be greater than the length of the second optical path OP2, which is not limited by the invention. Therefore, in the first status, a transmission path of the light beam L in the liquid state lens 120a is shorter. Namely, a blue light part of the light beam L is not liable to be absorbed by the liquid state lens 120a, so that the light beam L penetrating through the light output surface OS with the first shape has a higher color temperature (for example, a first color temperature, and a proportion of the blue light part in the light beam L is high). In the second status, a transmission path of the light beam L in the liquid state lens 120a is longer, the blue light part of the light beam L is liable to be absorbed by the liquid state lens 120a, so that the light beam L penetrating through the light output surface OS with the second shape has a lower color temperature (for example, a second color temperature, and the proportion of the blue light part in the light beam L is low).

According to the above description, in the light source module 100a of the present embodiment, the controller 140 provides different voltages to change the shape (or curvature) of the light output surface OS of the liquid state lens 120a, so as to change the optical characteristic (the color temperature or the light shape) of the light beam L emitted from the light output surface OS to cope with different usage requirements.

Moreover, in the present embodiment, the light source module 100a may selectively adopt the environmental parameter sensor 150. The environmental parameter sensor 150 is used for sensing an environmental parameter of the environment where the light source module 100a is located. For example, the environmental parameter sensor 150 is, for example, a humidity sensor. The environmental parameter is, for example, moisture in the environment. The environmental parameter sensor 150 is coupled to the controller 140. When the environmental parameter sensor 150 detects that a moisture concentration in the environment is lower than a predetermined value, the environmental parameter sensor 150 notifies such result to the controller 140. The controller 140 provides the first voltage to the liquid state lens 120a to make the liquid state lens 120a to be in the first status according to the above result. Therefore, the light beam L may have a higher color temperature after passing through the light output surface OS with the first shape, and now the light source module 100a is adapted to the environment with a lower humidity.

Conversely, when the environmental parameter sensor 150 detects that the moisture concentration in the environment is higher than the predetermined value, the environmental parameter sensor 150 notifies such result to the controller 140. The controller 140 provides the second voltage to the liquid state lens 120a to make the liquid state lens 120a to be in the second status according to the above result. Therefore, the light beam L may have a lower color temperature after passing through the light output surface OS with the second shape, and now the light source module 100a is adapted to the environment with a higher humidity.

In other embodiments, the environmental parameter sensor 150 may be a rainfall sensor, an ambient light sensor, a humidity sensor or a combination thereof, and the corresponding environmental parameters may be a rainfall capacity, a light intensity of ambient light, a humidity concentration or a combination of the above environmental parameters. The environmental parameter sensor 150 may measure different environmental parameters to notify the controller 140, and a result of the environmental parameters may serve as a reference for the controller 140 to determine an environment change. The controller 140 may accordingly adjust the characteristic of the liquid state lens 120a (the tunable-focal length lens). Therefore, the light source module 100a of the present embodiment may change the optical characteristic of the output light beam L in real-time through configuration of the environmental parameter sensor 150, so as to cope with today's trend of intelligent lighting.

In the aforementioned embodiment, the operation mode of the liquid state lens 120a may be implemented by the operation mode of any type of the liquid state lens 120a of the technical field, which is not limited by the invention. Those skilled in the art may learn enough instructions and recommendations for detailed steps and implementations of the liquid state lens 120a according to common knowledge of the technical field, and details thereof are not repeated.

It should be noted that a part of contents of the aforementioned embodiment is also used in the following embodiment, and descriptions of the same technical contents are omitted. The part of contents of the aforementioned embodiment may be referred for the same components, and detailed descriptions thereof are not repeated in the following embodiment.

Figure 2A:
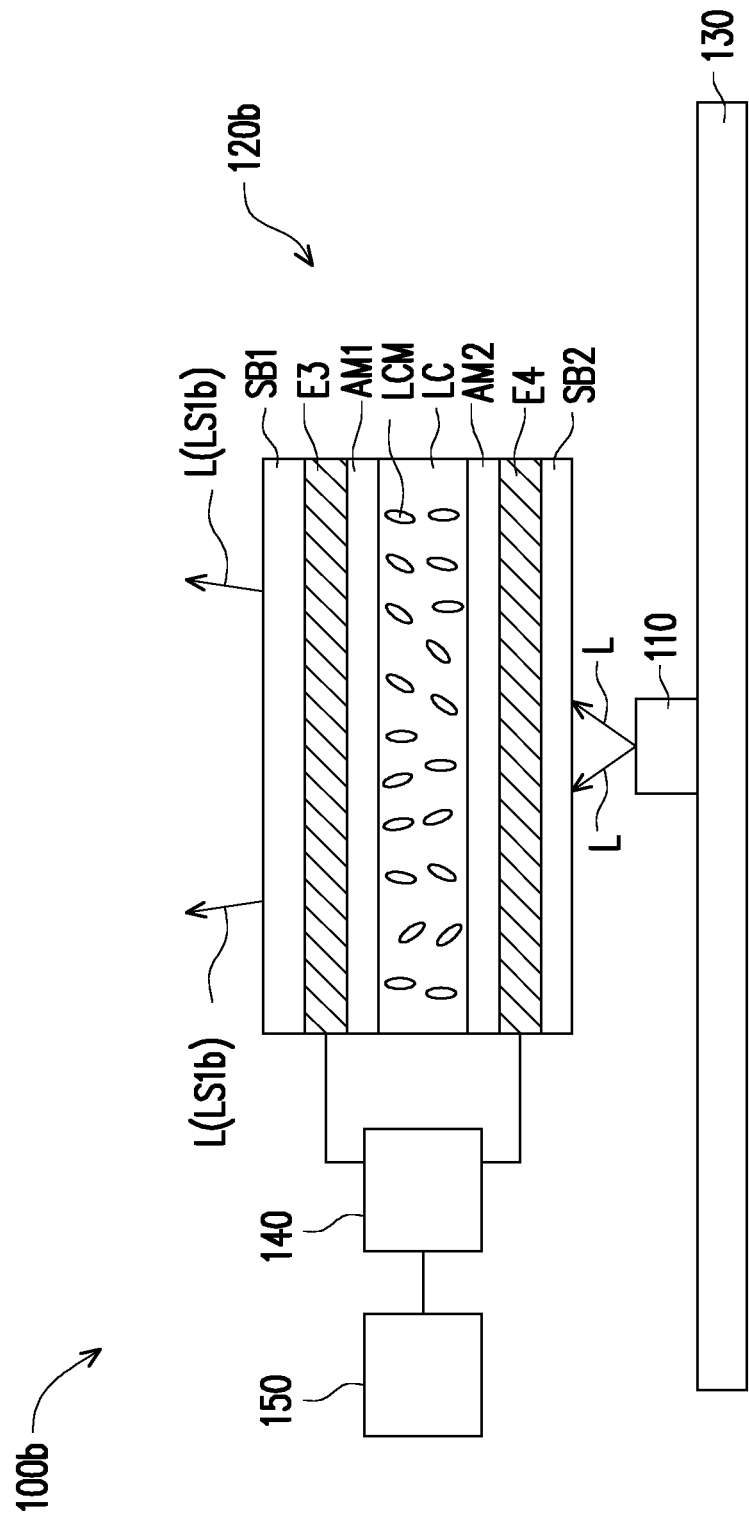
FIG. 2A is a schematic diagram of a light source module in a first status according to another embodiment of the invention.
Figure 2B:
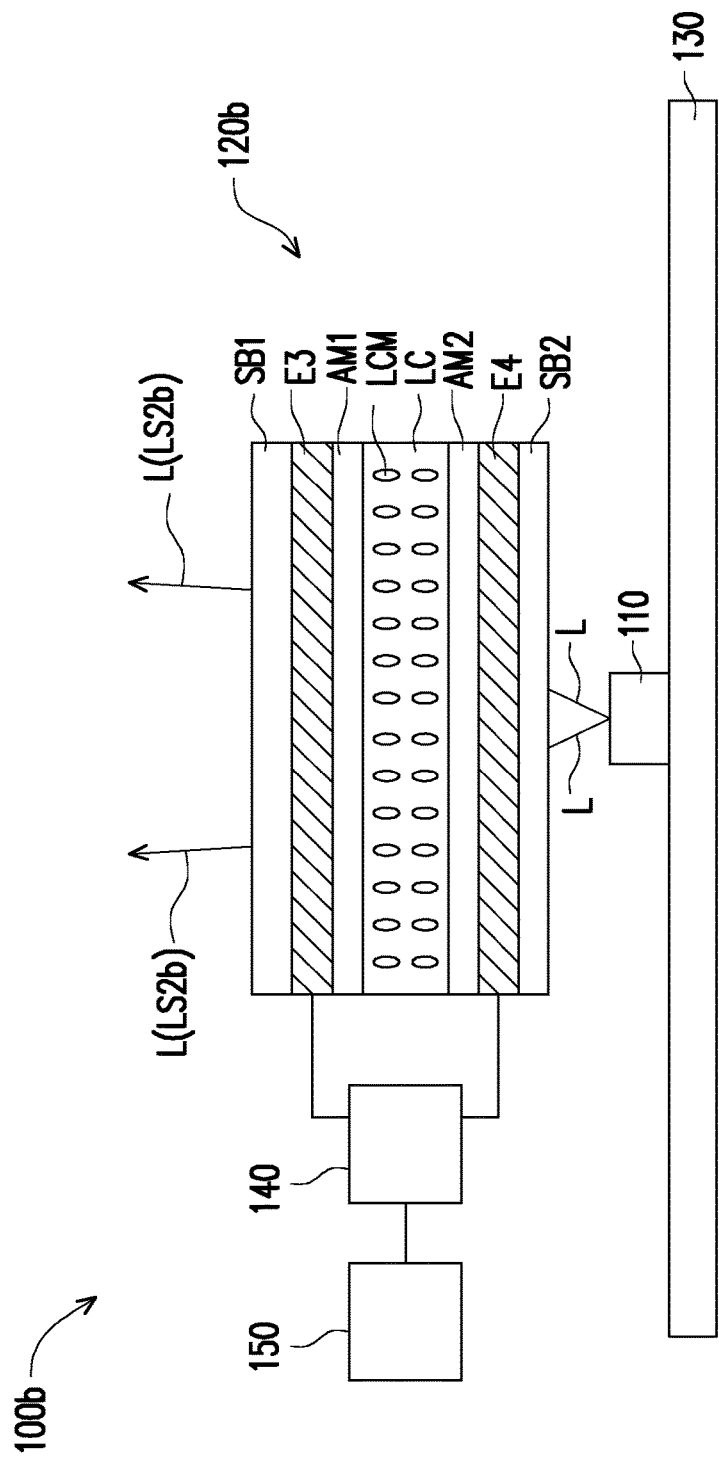
FIG. 2B is a schematic diagram of the light source module of FIG. 2A in a second status.

FIG. 2A is a schematic diagram of a light source module in a first status according to another embodiment of the invention. FIG. 2B is a schematic diagram of the light source module of FIG. 2A in a second status.

Referring to FIG. 2A and FIG. 2B, the light source module 100b of FIG. 2A and FIG. 2B is substantially similar to the light source module 100a of FIG. 1A and FIG. 1B, and a main difference there between is that in the light source module 100b, the tunable-focal length lens 120 is, for example, implemented by a liquid crystal tunable-focal length lens 120b, and the liquid crystal tunable-focal length lens 120b is taken as an example for description below, though the invention is not limited thereto. The liquid crystal tunable-focal length lens 120b includes two transparent substrates SB1, SB2 (which are, for example, glass substrates that are made of a transparent material) disposed opposite to each other, a liquid crystal layer LC, electrodes E3, E4 disposed opposite to each other, and two alignment layers AM1, AM2. The liquid crystal layer LC is clamped between the two alignment layers AM1, AM2. When the liquid crystal layer LC is not affected by an external electric field, liquid crystal molecules LCM close to the alignment layers AM1, AM2 are arranged along an alignment direction of the alignment layers AM1, AM2. The electrode E3 is disposed between the transparent substrate SB1 and the alignment layer AM1. The electrode E4 is disposed between the transparent substrate SB2 and the alignment layer AM2. The controller 140 is coupled to the electrodes E3, E4. The electrodes E3, E4 are, for example, transparent conductive layers, and are, for example, made of Indium Tin Oxide (ITO) or other transparent conductive material, which is not limited by the invention. The liquid crystal tunable-focal length lens 120b is disposed above the light emitting element 110. The light beam L emitted by the light emitting element 110 is output from the light source module 100b through the liquid crystal tunable-focal length lens 120b.

The controller 140 provides the voltage to the liquid crystal tunable-focal length lens 120b through the two electrodes E3 and E4, so as to change the liquid crystal tunable-focal length lens 120b to the first status or the second status. Optical behaviours of the light source 100b of the present embodiment in different statuses are described in detail below.

Referring to FIG. 2A, in the first status, the controller 140 provides a first voltage to the liquid crystal tunable-focal length lens 120b. The first voltage is, for example, zero volt or non-zero volt, which is not limited by the invention. The characteristic of the liquid crystal tunable-focal length lens 120b is an arrangement state of the liquid crystal molecules LCM in the liquid crystal tunable-focal length lens 120b. The liquid crystal tunable-focal length lens 120b receives the first voltage, at this moment, the arrangement state of the liquid crystal molecules LCM of the liquid crystal tunable-focal length lens 120b is a first arrangement state. The light beam L penetrating through the liquid crystal tunable-focal length lens 120b with the first arrangement state has a first light shape LS1b. The light beam L penetrating through the liquid crystal tunable-focal length lens 120b with the first arrangement state has a first color temperature.

Referring to FIG. 2B, in the second status, the controller 140 provides a second voltage to the liquid crystal tunable-focal length lens 120b. The second voltage is different to the first voltage. At this moment, the arrangement state of the liquid crystal molecules LCM is a second arrangement state. The light beam L penetrating through the liquid crystal tunable-focal length lens 120b with the second arrangement state has a second light shape LS2b. The light beam L penetrating through the liquid crystal tunable-focal length lens 120b with the second arrangement state has a second color temperature.

Referring to FIG. 2A and FIG. 2B, since the first voltage and the second voltage provided to the liquid crystal tunable-focal length lens 120b by the controller 140 are different, the first arrangement state and the second arrangement state of the corresponding liquid crystal molecules LCM are also different. In the light source module 100b, the corresponding liquid crystal molecules LCM have different orientations along with a change of the external electric field, and reflection ability of the liquid crystal molecules LCM affected by the external electric field is also changed. Therefore, in the different first state and second state, the first and the second light shapes LS1b, LS2b of the light beam L are also different from each other, and the first and the second color temperatures thereof are also different from each other.

According to the above description, in the light source module 100b of the present embodiment, the controller 140 provides different voltages to change the arrangement state of the liquid crystal molecules LCM in the liquid crystal tunable-focal length lens 120b, so as to change the optical characteristic (the color temperature or the light shape) of the light beam L penetrating through the liquid crystal tunable-focal length lens 120b to cope with different usage requirements.

In the aforementioned embodiment, the operation mode of the liquid crystal tunable-focal length lens 120b may be implemented by the operation mode of any type of the liquid crystal tunable-focal length lens 120b of the technical field, which is not limited by the invention. Those skilled in the art may learn enough instructions and recommendations for detailed steps and implementations of the liquid crystal tunable-focal length lens 120b according to common knowledge of the technical field, and details thereof are not repeated.

Figure 3:
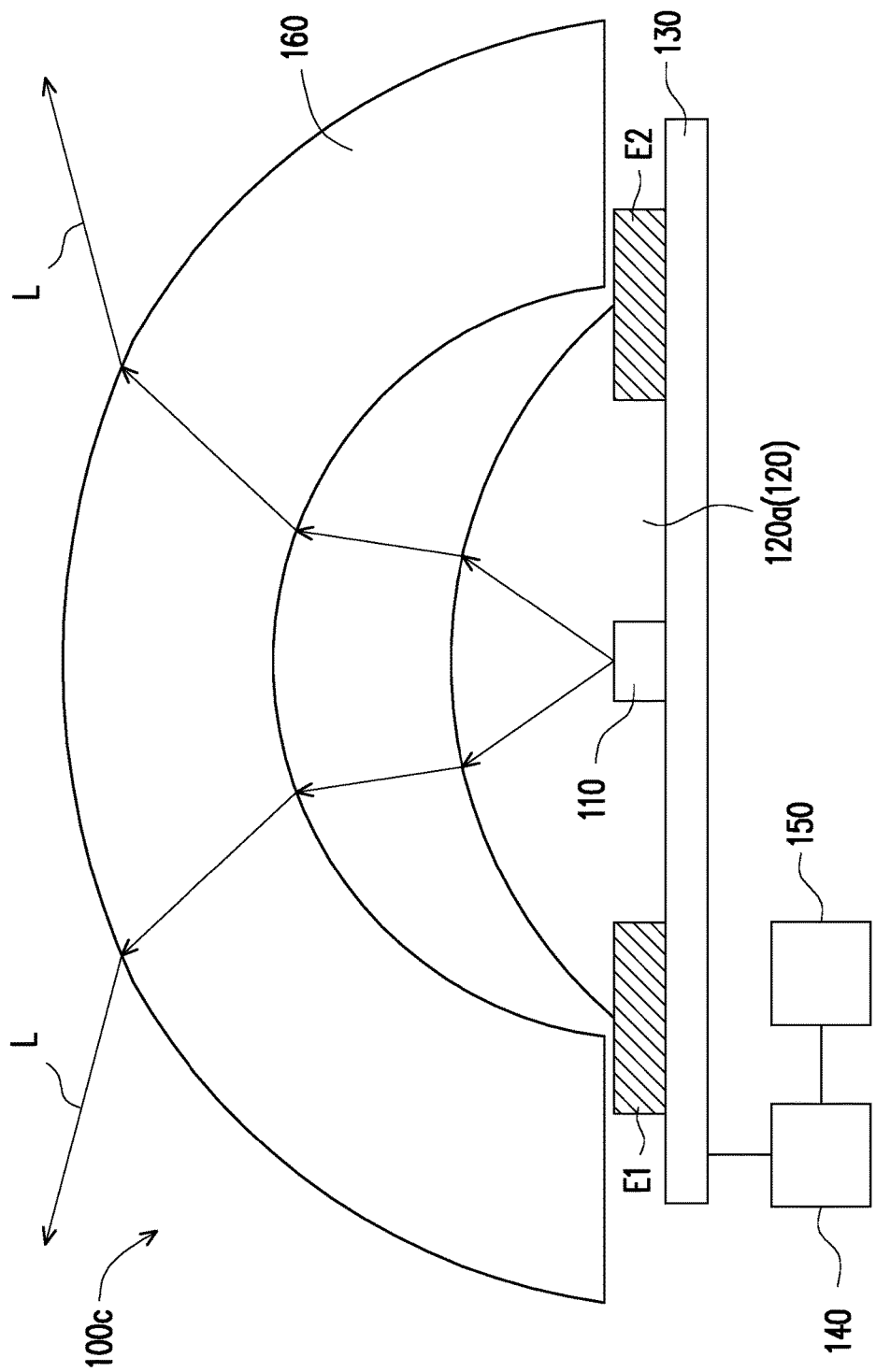
FIG. 3 and FIG. 4 are schematic diagrams of light source modules of different embodiments of the invention.
Figure 4:
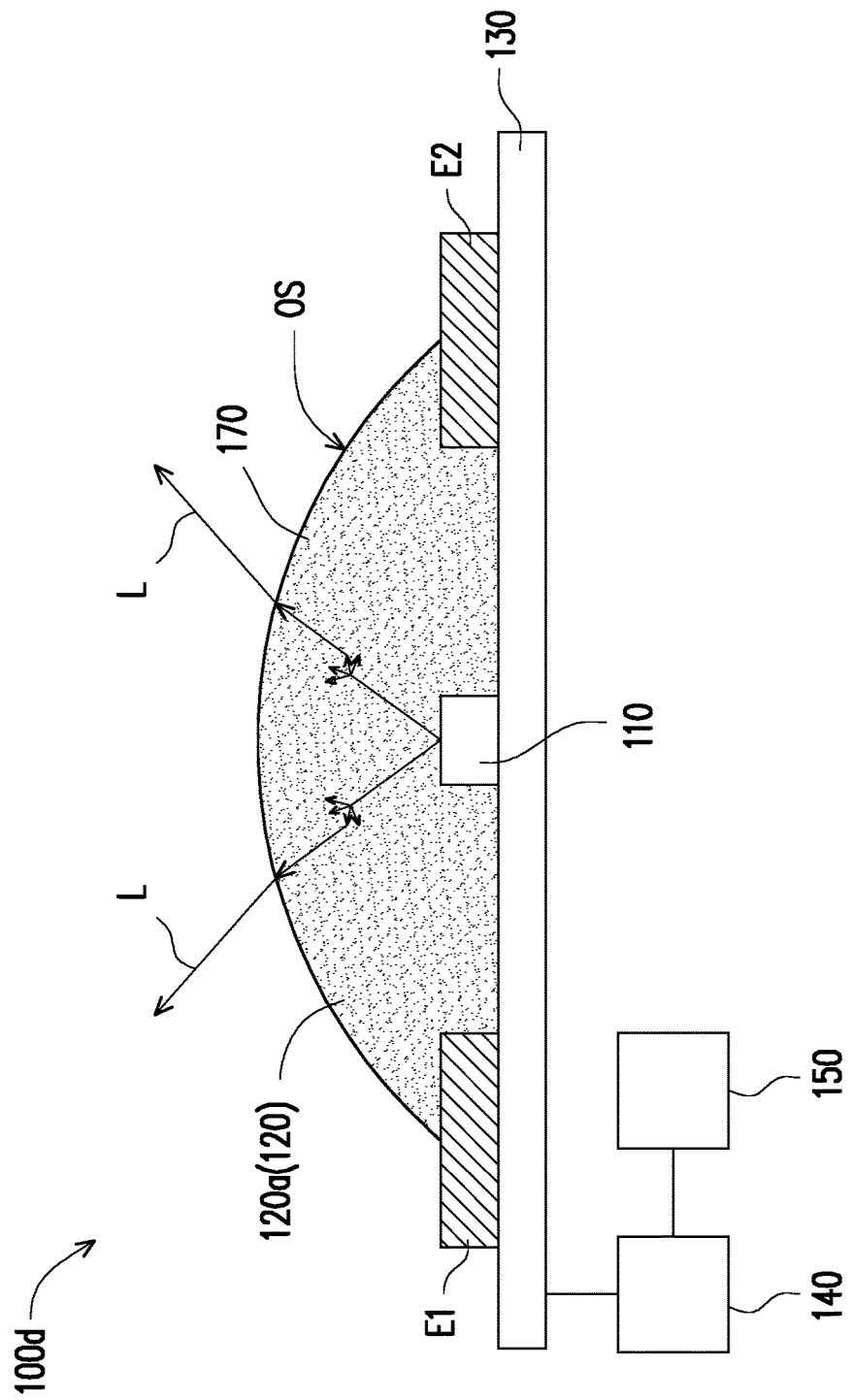

FIG. 3 and FIG. 4 are schematic diagrams of light source modules of different embodiments of the invention.

Referring to FIG. 3, in the present embodiment, the light source module 100c is substantially similar to the light source module 100a of FIG. 1A and FIG. 1B, and a main difference there between is that the light source module 100b further includes a secondary lens 160. The secondary lens 160 is disposed at a light path downstream of the liquid state lens 120a. In the embodiment of the invention, the situation that a second element is disposed at a light path downstream of a first element refers to that the light beam L first passes through the first element and then reaches the second element. Therefore, the light beam L passing through the light output surface OS further passes through the secondary lens 160. The secondary lens 160 is used for aligning the light beam L passing through the liquid state lens 120a. Certainly, in other embodiments of the invention, the secondary lens 160 may be selectively adopted in the similar way, which is not limited by the invention.

Referring to FIG. 4, in the present embodiment, the light source module 100d is substantially similar to the light source module 100a of FIG. 1A and FIG. 1B, and a main difference there between is that the light source module 100d further includes a plurality of light diffusion particles 170. The light diffusion particles 170 are disposed in the liquid state lens 120a. By configuring the light diffusion particles 170, when the light beam L is propagated in the liquid state lens 120a, the light beam L is liable to be diffused by the light diffusion particles 170, such that the optical path of the light beam L in the liquid state lens 120a is longer. The diffusion characteristic of the light diffusion particles 170 improves a proportion that the blue light part in the light beam L is absorbed by the liquid state lens 120a, such that the color temperature of the light beam L is further decreased. In an embodiment, the light diffusion particles 170 are phosphor powder having a wavelength conversion function. In other embodiments, the light diffusion particles 170 may be diffusion particles without the wavelength conversion function.

In summary, in the light source module of the invention, the controller adjusts the characteristic of the tunable-focal length lens in different statuses, such that when the light beam penetrates through the tunable-focal length lens in different statuses, the corresponding optical characteristic thereof is changed, so that the lighting fixture having the light source module of the invention is adapted to different environments.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A light source module, comprising:
   a light emitting element, configured to emit a light beam;
   a tunable-focal length lens, disposed on a transmission path of the light beam; and
   a controller, coupled to the tunable-focal length lens, and adjusting a characteristic of the tunable-focal length lens in a first status and a second status,
   wherein
   in the first status, the light beam penetrating through the tunable-focal length lens has a first color temperature,
   in the second status, the light beam penetrating through the tunable-focal length lens has a second color temperature,
   wherein the first color temperature is different to the second color temperature.
2. The light source module as claimed in claim 1, wherein
   in the first status, the controller provides a first voltage to the tunable-focal length lens, and the light beam penetrating through the tunable-focal length lens has a first light shape,
   in the second status, the controller provides a second voltage to the tunable-focal length lens, and the light beam penetrating through the tunable-focal length lens has a second light shape,
   wherein the first voltage is different to the second voltage.
3. The light source module as claimed in claim 1, wherein the tunable-focal length lens is a liquid state lens or a liquid crystal tunable-focal length lens.
4. The light source module as claimed in claim 1, wherein the tunable-focal length lens has a light output surface, wherein the characteristic is a shape of the light output surface,
   in the first status, the light output surface of the tunable-focal length lens has a first shape,
   in the second status, the light output surface of the tunable-focal length lens has a second shape,
   wherein the first shape is different to the second shape.
5. The light source module as claimed in claim 1, wherein the tunable-focal length lens has a light output surface,
   in the first status, a path of the light beam transmitted from the light emitting element to the light output surface is a first optical path,
   in the second status, a path of the light beam transmitted from the light emitting element to the light output surface is a second optical path, wherein a length of the first optical path is different to a length of the second optical path.

6. The light source module as claimed in claim 1, further comprising: a plurality of light diffusion structures, disposed in the tunable-focal length lens.

7. The light source module as claimed in claim 1, further comprising: an environmental parameter sensor, configured to sense an environmental parameter of an environment where the light source module is located, and the controller provides a voltage to the tunable-focal length lens according to the environment parameter.

8. The light source module as claimed in claim 1, further comprising: a secondary lens, disposed at a light path downstream of the tunable-focal length lens.

9. The light source module as claimed in claim 3, wherein the tunable-focal length lens is the liquid crystal tunable-focal length lens, the characteristic is an arrangement state of the liquid crystal tunable-focal length lens,
- in the first status, the arrangement state of liquid crystal molecules of the liquid crystal tunable-focal length lens is a first arrangement state,
- in the second status, the arrangement state of the liquid crystal molecules of the liquid crystal tunable-focal length lens is a second arrangement state,
- wherein the first arrangement state is different to the second arrangement state.

* * * * *